(12) United States Patent
Maebashi et al.

(10) Patent No.: US 9,966,222 B2
(45) Date of Patent: May 8, 2018

(54) SAMPLE HOLDER

(71) Applicant: HONDA MOTOR CO., LTD., Minato-ku, Tokyo (JP)

(72) Inventors: Takanori Maebashi, Wako (JP); Nariaki Kuriyama, Wako (JP); Yoshiya Fujiwara, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days. days.

(21) Appl. No.: 15/243,301

(22) Filed: Aug. 22, 2016

(65) Prior Publication Data

US 2017/0062176 A1 Mar. 2, 2017

(30) Foreign Application Priority Data

Aug. 25, 2015 (JP) .................................. 2015-165793

(51) Int. Cl.
*H01J 37/20* (2006.01)
*H01R 12/72* (2011.01)

(52) U.S. Cl.
CPC ............ *H01J 37/20* (2013.01); *H01R 12/721* (2013.01); *H01R 2201/20* (2013.01)

(58) Field of Classification Search
CPC ......... H01J 37/20; H01J 37/2008; H01J 37/26
See application file for complete search history.

(56) References Cited

U.S. PATENT DOCUMENTS

| 8,334,519 B2 * | 12/2012 | Ono | G01R 31/307 250/306 |
| 2006/0025002 A1 * | 2/2006 | Zhang | H01J 37/20 439/329 |
| 2008/0067374 A1 * | 3/2008 | Ono | G01R 31/307 250/310 |

(Continued)

FOREIGN PATENT DOCUMENTS

JP 2013-535795 A 9/2013

OTHER PUBLICATIONS

Unocic et al., "In-Situ Electron Microscopy of Electrical Energy Storage Materials" [online], 2015, retrieved on Jan. 30, 2015 from the Internet <URL: http://www1.eere.energy.gov/vehiclesandfuels/pdfs/merit_review_2011/electrochemical_storage/es095_unocic_2011_o_pdf>.

*Primary Examiner* — Wyatt Stoffa
(74) *Attorney, Agent, or Firm* — Carrier Blackman & Associates, P.C.; Joseph P. Carrier; Jingli Wang

(57) ABSTRACT

A sample holder includes an adapter attached to an adapter attaching part. An analysis target, e.g., analytical cell, has first electrical connection members. The adapter has second electrical connection members. The number of the first electrical connection members and the number of the second electrical connection members are the same. Further, the adapter has third electrical connection members, and the adapter attaching part has fourth electrical connection members. The number of the third electrical connection members and the number of the fourth electrical connection members (Continued)

are the same. For example, the third electrical connection members are six electrically conductive membranes, i.e., a first electrically conductive membrane to a sixth electrically conductive membrane. Among the six electrically conductive membranes, only the third electrically conductive membrane is not electrically connected to any of the second electrical connection members and the first electrical connection members.

14 Claims, 9 Drawing Sheets

(56) References Cited

U.S. PATENT DOCUMENTS

| | | | | |
|---|---|---|---|---|
| 2010/0320396 | A1* | 12/2010 | Terada | H01J 37/20 250/441.11 |
| 2011/0032611 | A1* | 2/2011 | Mick | H01J 37/20 359/395 |
| 2011/0140729 | A1* | 6/2011 | Nakamura | G01R 31/307 324/762.01 |
| 2013/0264476 | A1* | 10/2013 | Damiano, Jr. | H01J 37/20 250/307 |
| 2014/0138558 | A1* | 5/2014 | Damiano, Jr. | H01R 12/79 250/453.11 |
| 2014/0268321 | A1* | 9/2014 | Damiano, Jr. | G02B 21/26 359/391 |

\* cited by examiner

SAMPLE HOLDER

CROSS-REFERENCE TO RELATED APPLICATION

This application is based upon and claims the benefit of priority from Japanese Patent Application No. 2015-165793 filed on Aug. 25, 2015, the contents of which are incorporated herein by reference.

BACKGROUND OF THE INVENTION

Field of the Invention

The present invention relates to a sample holder for holding an analysis target in an analytical instrument, for analysis of the analysis target by the analytical instrument.

Description of the Related Art

In recent years, attempts have been made to analyze what kind of changes occur at the time of applying stimulus such as electrical current or heat to various elements, using an analytical instrument, e.g., as described in In-situ Electron Microscopy of Electrical Energy Storage Materials (Annual Merit Review, DOE Vehicle Technologies Program, Washington, D.C., May 9-13, 2011).

In this case, such an element is held by a sample holder, and the sample holder is attached to an analytical instrument such as a transmission electron microscope (TEM). As this type of sample holder, for example, a sample holder proposed in Japanese Laid-Open Patent Publication No. 2013-535795 (PCT) is known.

A plurality of wiring lines are accommodated inside this sample holder. The wiring lines are electrically connected to electrodes of an electrical bias device, a heating device, etc. held by the sample holder. When electrical current is supplied through the wiring lines, electrochemical reactions occur in the case of the electrical bias device, and heat is applied in the case of the heating device. In such occasions, using the analytical instrument, it is possible to analyze the state of electrochemical reactions of the electrical bias device, or the state of the heating device under the heating environment.

In Japanese Laid-Open Patent Publication No. 2013-535795 (PCT), the number of electrodes of the electrical bias device or the heating device is four. The sample holder has four electrical current supply lines for connecting the electrodes to the wiring lines, respectively. That is, all of the number of electrodes of the element, the number of the electrical current supply line of the sample holder, and the number of wiring lines are the same.

SUMMARY OF THE INVENTION

The number of electrodes of the element is not always four. Further, the electrodes are not always arranged at the same positions. Therefore, depending on the element, it is difficult to electrically connect all of the electrodes to the electrical current supply lines. In short, the sample holder lacks versatility, and for this reason, there is a problem that another sample holder needs to be prepared depending on the element disadvantageously.

A main object of the present invention is to provide a sample holder which makes it possible to supply electrical current to an analysis target through electrical connection members of the analysis target regardless of the number and the installation positions of the electrical connection members.

Another object of the present invention is to provide a sample holder having sufficient versatility.

According to an embodiment of the present invention, a sample holder for an analytical instrument is provided. The sample holder holds an analysis target having one or more first electrical connection members in the analytical instrument. The sample holder includes:

an adapter attaching part to which an adapter holding the analysis target is attached;

a cylindrical part configured to accommodate therein electrically conductive members electrically connected to the first electrical connection members; and a connector attaching part to which a connector electrically connected to the electrically conductive members is attached, wherein the adapter has second electrical connection members and third electrical connection members, the number of the second electrical connection members being the same as the number of the first electrical connection members, the number of the third electrical connection members being larger than the number of the second electrical connection members, the adapter attaching part has fourth electrical connection members, the number of the fourth electrical connection members being the same as the number of the third electrical connection members and also the same as the number of the electrically conductive members, all of the first electrical connection members are electrically connected respectively to all of the second electrical connection members, among the third electrical connection members, the same number of third electrical connection members as the second electrical connection members are electrically connected respectively to the second electrical connection members, and at least one of the third electrical connection members is not electrically connected to any of the second electrical connection members, and all of the fourth electrical connection members are electrically connected respectively to all of the third electrical connection members and also respectively to all of the electrically conductive members.

As described above, in the present invention, the analysis target has the first electrical connection members and the adapter has the second electrical connection members. The number of the first electrical connection members is the same as the number of the second electrical connection members. Further, the adapter has the third electrical connection members and the adapter attaching part has the fourth electrical connection members. The number of the third electrical connection members is the same as the number of the fourth electrical connection members. In the structure, even in the case where the number of the first electrical connection members (electrical contacts) of the analysis target and the number of the electrically conductive members provided in the sample holder are different, all of the first electrical connection members of the analysis target can be electrically connected to the external device. That is, it is not necessary to change the entire sample holder with another one for matching with the number of the first electrical connection members of the analysis target.

In the case of holding another analysis target having a different number of first electrical connection members, the adapter only has to be changed with another adapter that has the same number of the second electrical connection members as the number of the first electrical connection members of the other analysis target. By changing of the adapter in this manner, the same body of the sample holder can be used.

Thus, improvement in the versatility of the sample holder is achieved. Accordingly, the equipment investment for the sample holder is reduced, and advantages in terms of cost are obtained.

Therefore, it is not necessary to change the sample holder with another sample holder that has the same number of electrically conductive members (wiring lines, etc.) as the number of the first electrical connection members of the analysis target. Stated otherwise, it is also not necessary to provide a plurality of sample holders having different numbers of electrically conductive members. Accordingly, the equipment investment for the sample holder is reduced, and advantages in terms of cost are obtained.

In this regard, if the number of the first electrical connection members is larger than the number of second electrical connection members, some of the first electrical connection members cannot be electrically connected to the external device. Therefore, it is difficult to supply electrical current to the analysis target and collect electric current from the analysis target.

Conversely, if the number of the first electrical connection members is smaller than the second electrical connection members, some of the second electrical connection members cannot be electrically connected to the first electrical connection members. In the case where the second electrical connection members directly contact the first electrical connection members, a space is formed between at least one of the second electrical connection members and the analysis target. This is because, in this case, no first electrical connection member is present between the analysis target and the second electrical connection members. Therefore, there is a concern that a backlash may occur between the analysis target and the adapter.

The above concern exists also in the case where the number of the third electrical connection members and the number of the fourth electrical connection members are different.

In contrast, in the present invention, the number of the first electrical connection members and the number of the second electrical connection member are the same, and the number of the third electrical connection members and the number of the fourth electrical connection members are the same. Therefore, electrical current can be supplied to, and collected from the analysis target without significant difficulties. Further, occurrence of the backlash between the analysis target and the adapter can be suppressed.

In the case where the analytical instrument uses an electron beam, a first electron beam transmission hole may be formed in the adapter attaching part, and a second electron beam transmission hole overlapped with the first electron beam transmission hole may be formed in the adapter. In this manner, the electron beam that has passed through the analysis target can be emitted to the outside easily from the adapter and the adapter attaching part.

The adapter may be accommodated in a first accommodating recess formed in the adapter attaching part, and the analysis target may be accommodated in a second accommodating recess formed in the adapter. In this manner, the adapter and the analysis target are accommodated in the accommodating recesses, and accordingly the sample holder has a compact structure.

In this case, preferably, the adapter is sandwiched between the adapter attaching part and the fourth electrical connection members, and also sandwiched between the adapter attaching part and a pressing member. In the structure, it becomes difficult for the adapter to be detached from the adapter attaching part. Further, it becomes possible to suppress the backlash of the adapter to a greater extent.

For the same reason, preferably, the analysis target is sandwiched between the adapter and the second electrical connection member, and also sandwiched between the adapter and the pressing member. In the structure, it becomes difficult for the analysis target to be detached from the adapter. Further, it becomes possible to suppress the backlash of the analysis target to a greater extent.

Preferably, at least either the second electrical connection members or the fourth electrical connection members are flat springs. In this case, since an elastic force is applied to the analysis target or the adapter, and the analysis target or the adapter is pressed, it becomes more difficult for the analysis target to be detached from the adapter, or for the adapter to be detached from the adapter attaching part.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
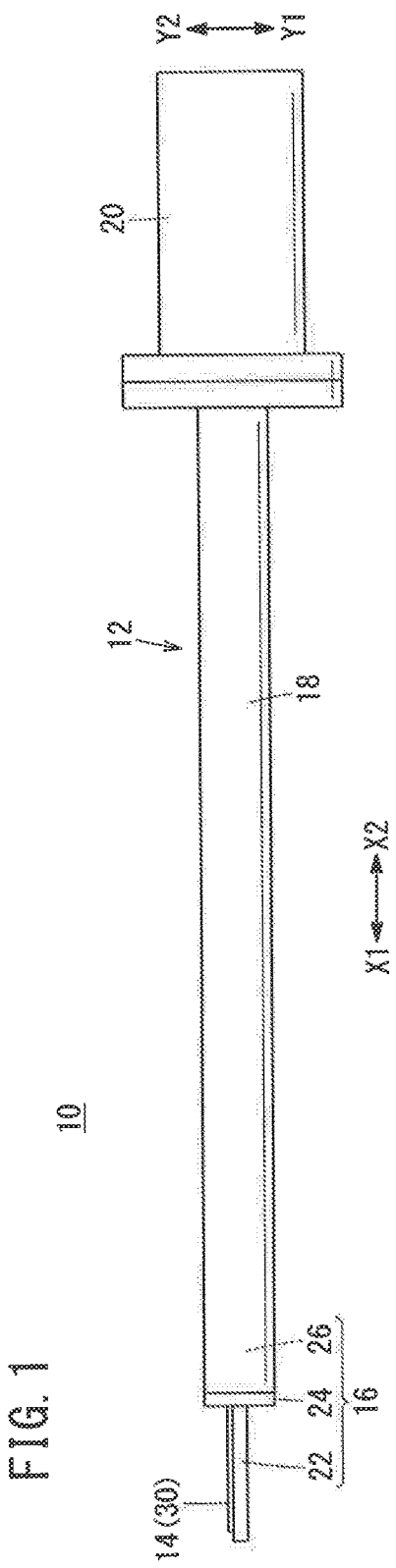
FIG. 1 is an overall side view schematically showing a sample holder according to an embodiment of the present invention.

Hereinafter, a preferred embodiment of a sample holder according to the present invention will be described in detail with reference to the accompanying drawings. It should be noted that X1, X2, Y1, Y2 denote the same directions, respectively, throughout the drawings. In FIGS. 2, 4, 6, and 8, the Y1 direction is a direction toward the backside of the drawing sheet, and the direction indicated by the arrow Y2 is a direction toward the front side of the drawing sheet.

FIG. 1 is an overall side view schematically showing a sample holder 10 according to an embodiment of the present invention. The sample holder 10 includes an elongated holder body 12 and an adapter 14.

Figure 2:
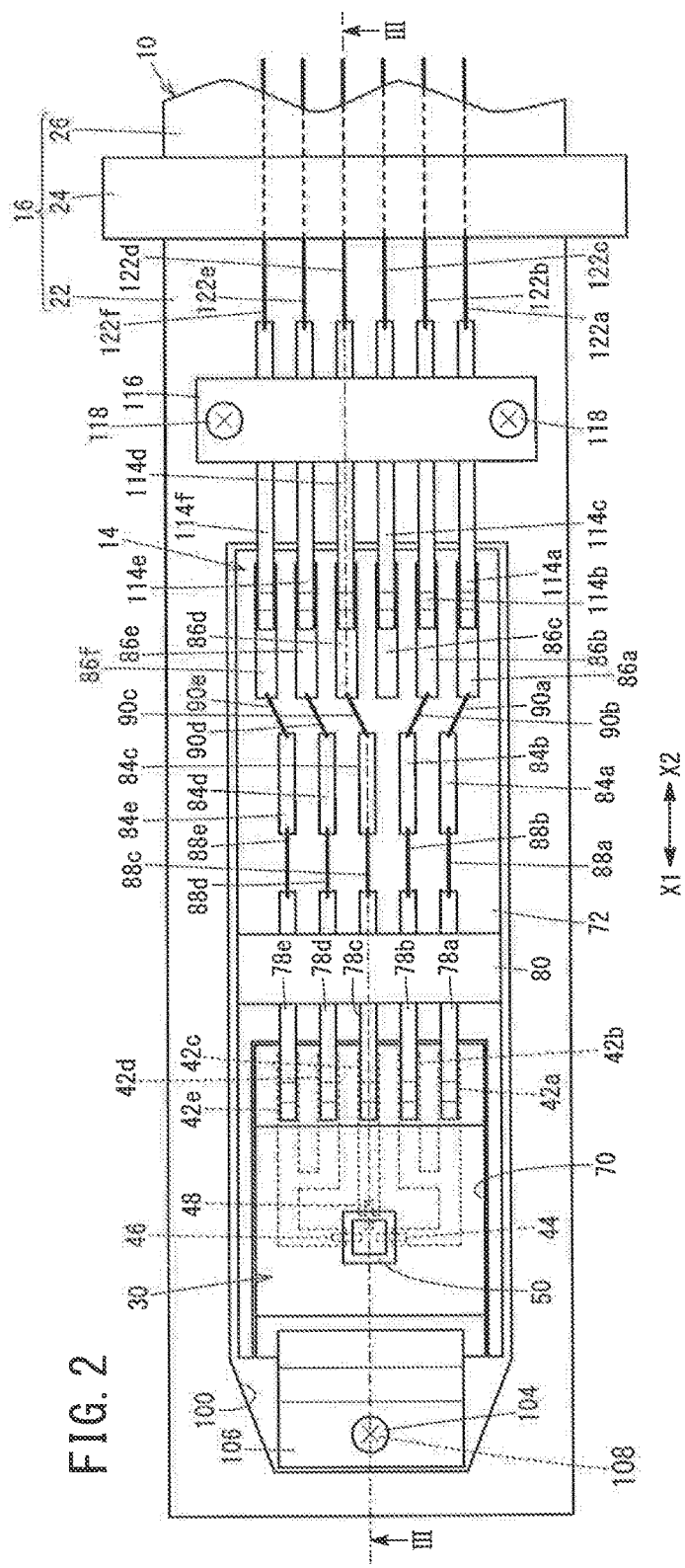
FIG. 2 is a plan view showing main part of the sample holder, in a state where an adapter holding an analytical cell (analysis target) is attached to an adaptor attaching part of the sample holder.
Figure 3:
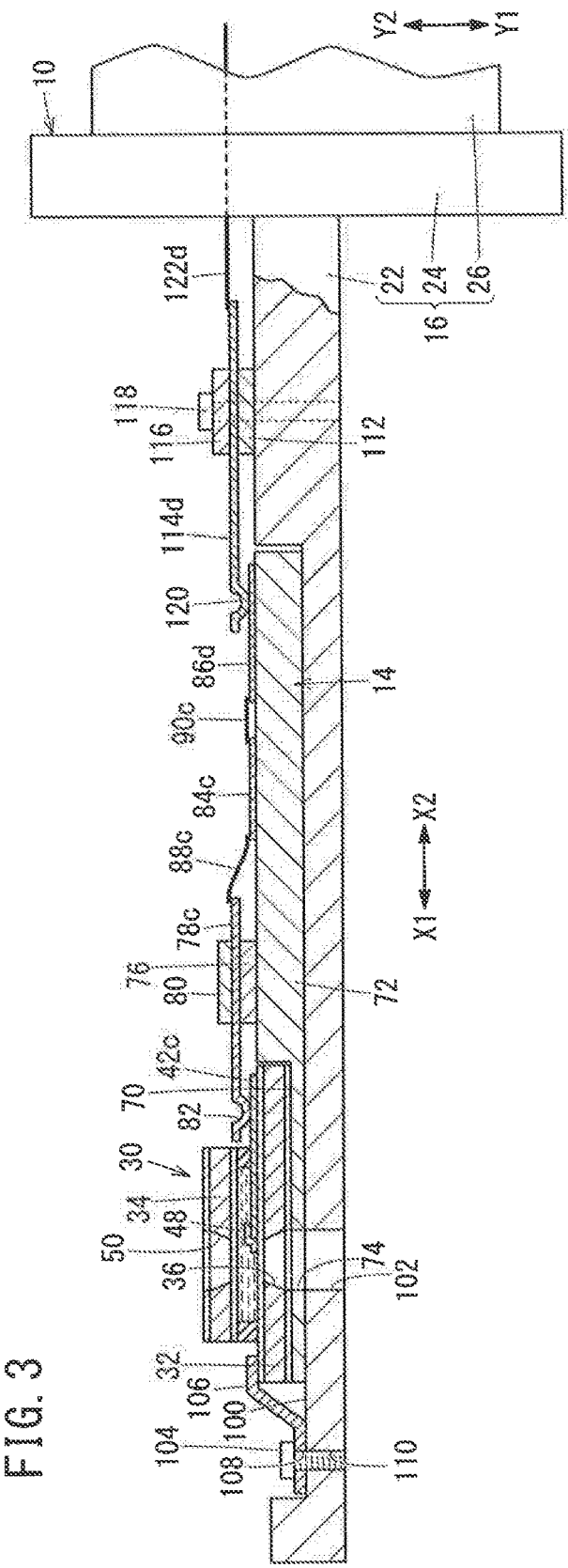
FIG. 3 is a cross sectional view taken along line III-III indicated by arrows in FIG. 2.

The holder body 12 is formed by connecting an adapter attaching part 16, a hollow cylindrical part 18, and a connector attaching part 20, in the order recited, from the X1 side to the X2 side in FIG. 1. The connector attaching part 20 has the largest outer diameter. As shown in FIGS. 2 and 3, the adapter attaching part 16 includes an attaching part body 22 having a substantially flat plate shape, a coupling flange 24 having a substantially circular disk shape, and an insert part 26 having a substantially cylindrical shape. The attaching part body 22 protrudes from one circular end surface of the coupling flange 24. The insert part 26 protrudes from the other circular end surface of the coupling flange 24, and the insert part 26 is inserted into the cylindrical part 18.

The adapter 14 holds an analytical cell 30 as an analysis target. Firstly, the analytical cell 30 will be described with reference to FIGS. 4 and 5.

In this case, the analytical cell 30 is part of a lithium ion secondary battery. More specifically, the analytical cell 30 is formed by stacking a first substrate 32 and a second substrate 34 having a small area in comparison with the first substrate 32. For example, the first substrate 32 is a substrate made of silicon (Si), silicon nitride ($Si_3N_4$), Si with oxide coating of $SiO_2$ or the like, borosilicate glass, quartz ($SiO_2$), or the like. A first through hole 36 having a substantially square shape in a plan view is formed in the thickness direction (Y1-Y2 direction in FIG. 5).

Figure 5:
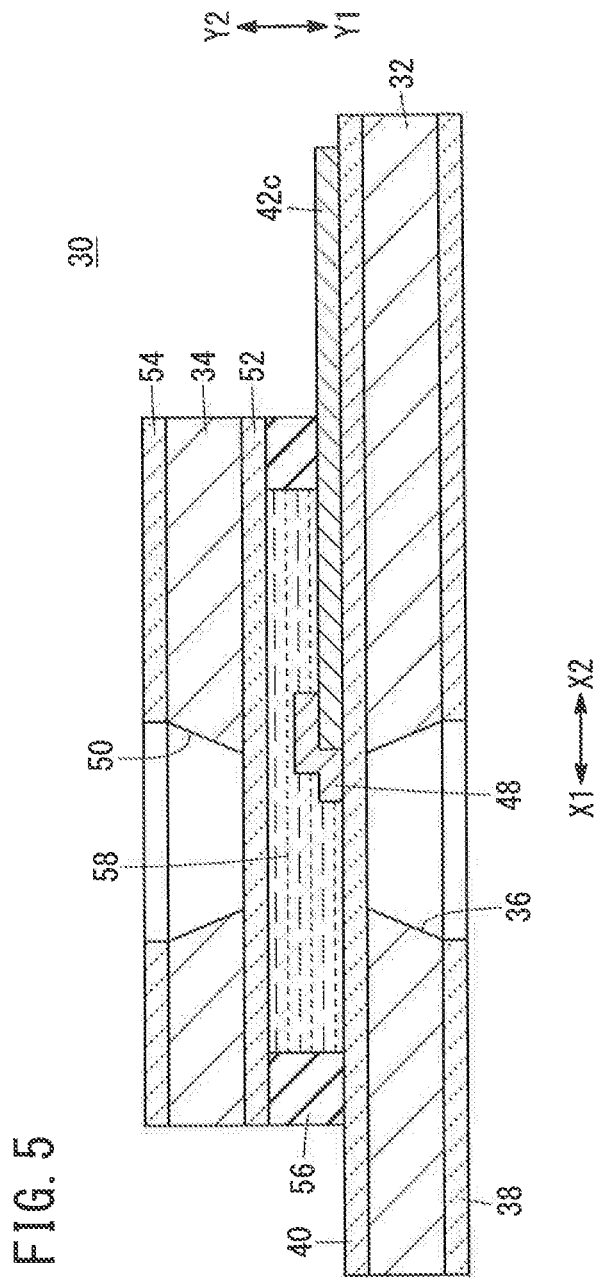
FIG. 5 is a cross sectional view taken along line V-V indicated by arrows in FIG. 4.

As shown in FIG. 5, a first covering membrane 38 is provided at an end surface of the first substrate 32 on the Y1 side in a manner that the first through hole 36 is exposed. For example, the first covering membrane 38 is made of a material having an electron beam permeability (electron beam transparency). Preferable examples of the material include silicon nitride ($Si_3N_4$), silicon carbide (SiC), etc. A first transmission membrane 40 is formed on the back surface of the first substrate 32, that is, at an end surface on the Y2 side facing the second substrate 34, so as to cover the first through hole 36. The first transmission membrane 40 may be made of the same material as the first covering membrane 38.

Figure 4:
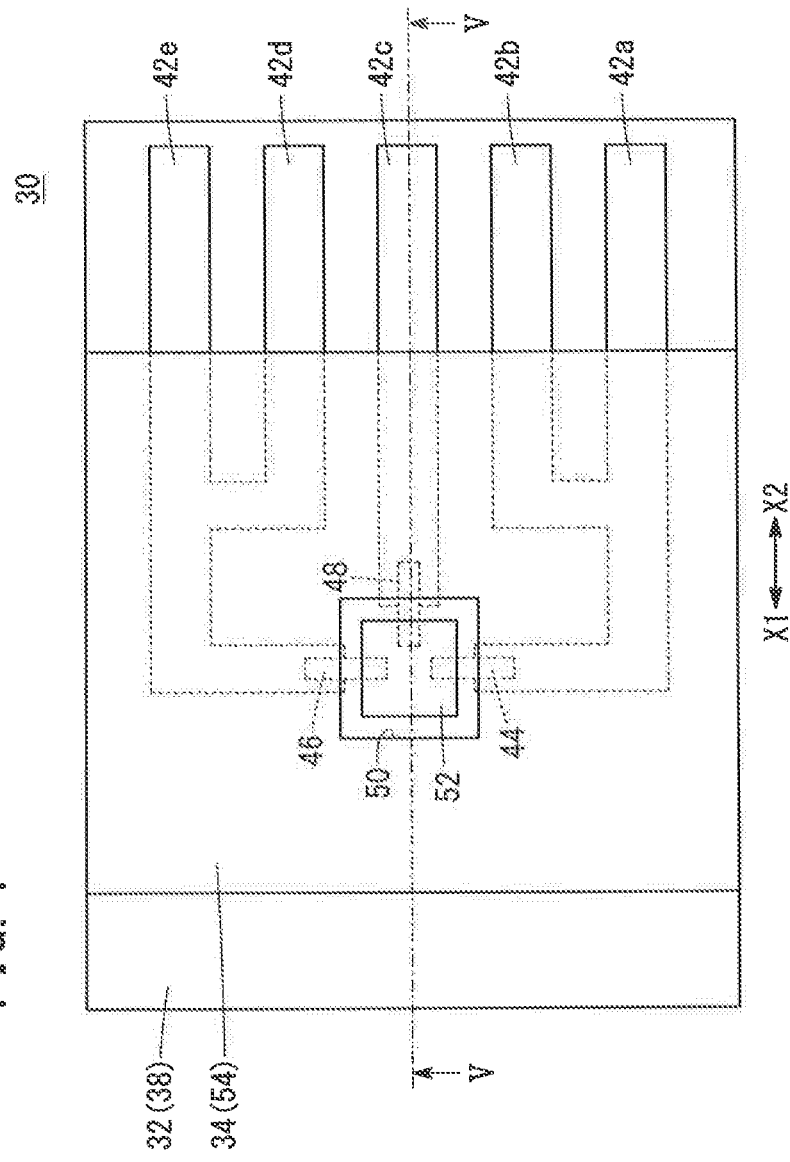
FIG. 4 is an overall plan view schematically showing the analytical cell (analysis target)

As can be easily understood from FIG. 4, a first electrode 42a to a fifth electrode 42e, which are first electrical connection members, are formed as thin membranes on an end surface of the first substrate 32 on the X2 side. That is, in the embodiment of the present invention, there are five first electrical connection members. An end of each of the first electrode 42a to the fifth electrode 42e on the X2 side is exposed from the overlapping portion of the first substrate 32 and the second substrate 34.

The first electrode 42a and the second electrode 42b are merged in the overlapping portion, and extend toward the first through hole 36. Likewise, the fourth electrode 42d and the fifth electrode 42e are merged in the overlapping portion, and extend toward the first through hole 36. The merged end of the first electrode 42a and the second electrode 42b and the merged end of the fourth electrode 42d and the fifth electrode 42e are positioned face-to-face with each other across the first through hole 36.

A negative electrode active material layer 44 is provided at the merged end of the first electrode 42a and the second electrode 42b. The negative electrode active material layer is made of, for example, Li, Li alloy, $Li_4Ti_5O_{12}$, Si, Si oxide, Ge, Sn, Sn alloy, Sn oxide, Al, Al alloy, Al oxide, carbon (C), etc. That is, one part of the negative electrode active material layer 44 is stacked on the merged end, and the other part of the negative electrode active material layer 44 is stacked on the first transmission membrane 40, at a position corresponding to the first through hole 36.

A positive electrode active material layer 46 is provided at the merged end of the fourth electrode 42d and the fifth electrode 42e. The positive electrode active material layer 46 is made of, for example, $LiCoO_2$, $LiMnO_2$, $LiMn_2O_4$, $LiNiO_2$, $LiFePO_4$, $Li_2FePO_4F$, $LiCo_{1/3}Ni_{1/3}Mn_{1/3}O_2$, or $Li(Li_xNi_xMn_yCo_z)O_2$, etc. One part of the positive electrode active material layer 46 is stacked on the merged end, and the other part of the positive electrode active material layer 46 is stacked on the first transmission membrane 40, at a position corresponding to the first through hole 36. It is a matter of course that the positive electrode active material layer 46 and the negative electrode active material layer 44 are positioned face-to-face with each other across the first through hole 36.

The first electrode 42a and the fifth electrode 42e are control electrodes for supplying electrical current at the time of charging of the analytical cell 30 (lithium ion secondary cell), and collecting electrical current at the time of discharging of the analytical cell 30. The second electrode 42b and the fourth electrode 42d are measurement electrodes for actually measuring the control voltage of the control electrodes (positive electrode or negative electrode) of the analytical cell 30. That is, a measurement instrument for actually measuring the control voltage is connected to the second electrode 42b and the fourth electrode 42d.

The remaining third electrode 42c extends straight from a position adjacent to the first through hole 36 to a position adjacent to the end of the first substrate 32 on the X2 side. The end of the third electrode 42c on the X1 side is spaced from the merged end (negative electrode active material layer 44) of the first electrode 42a and the second electrode 42b by substantially 90°, and spaced from the merged end (positive electrode active material layer 46) of the fourth electrode 42d and the fifth electrode 42e by substantially 90°. A reference electrode layer 48, e.g., made of Li, is provided at an end of the third electrode 42c on the X1 side. As shown in FIG. 5, one part of the reference electrode layer 48 is stacked on an end of the third electrode 42c on the X1 side, and the other part of the reference electrode layer 48 is stacked on the first transmission membrane 40, at a position corresponding to the first through hole 36.

The second substrate 34 is overlapped with the first substrate 32 having the above structure. The second substrate 34 is made of the same material as the first substrate 32. A second through hole 50 having a substantially square shape in a plan view is formed in the thickness direction (Y1-Y2 direction in FIG. 5). Further, a second transmission membrane 52 is formed at an end surface of the second substrate 34 on the Y1 side facing the first substrate 32 in a manner to cover the second through hole 50, and a second covering membrane 54 is formed at the end surface of the second substrate 34 on the Y2 side as the back surface, in a manner to expose the second through hole 50. The second transmission membrane 52 and the second covering membrane 54 are made of the same materials as the first covering membrane 38 and the first transmission membrane 40.

Sealant 56 of epoxy based resin adhesive or the like is circumferentially arranged in the vicinity of the marginal portion of the second substrate 34, whereby small clearance is formed between the first substrate 32 and the second substrate 34. A liquid-tight space formed by the clearance is filled with suitable electrolytic solution 58 such as propylene carbonate. The negative electrode active material layer 44, the positive electrode active material layer 46, and the reference electrode layer 48 contact the electrolytic solution 58, respectively. A spacer (not shown) may be provided between the first substrate 32 and the second substrate 34.

The first through hole 36 and the second through hole 50 are overlapped with (in alignment with) each other to form an observation window. An electron beam that has entered the cell through the second through hole 50, for example, is transmitted through the second transmission membrane 52, the liquid tight space, and the first transmission membrane 40, and then the electron beam is emitted to the outside through the first through hole 36.

The analytical cell 30 having the above structure can be produced, for example, in accordance with the manner described in Japanese Laid-Open Patent Publication No. 2014-186877.

Figure 6:
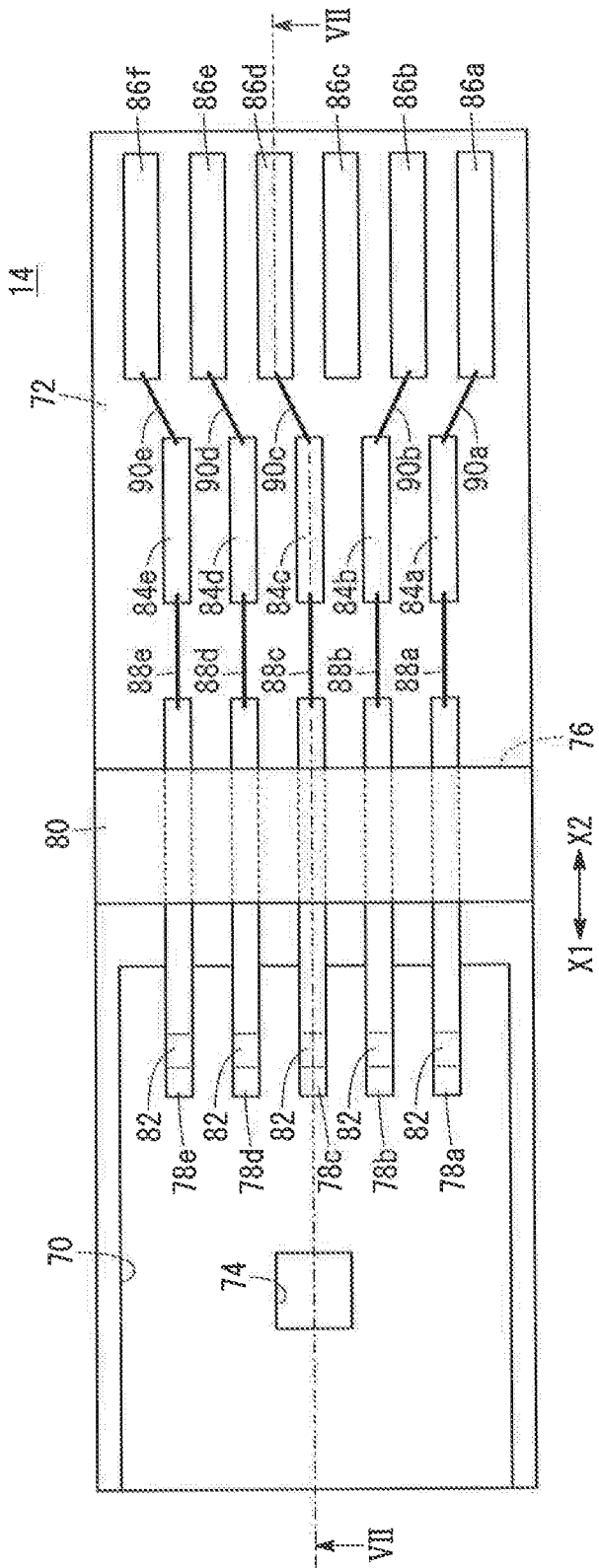
FIG. 6 is an overall plan view schematically showing the adapter.

Next, the adapter 14 holding the analytical cell 30 will be described with reference to FIGS. 6 and 7.

The adapter 14 has a substantially flat shape, and includes a base 72. The base 72 is made of insulating material, and an end of the base 72 on the X1 side is depressed to form a first accommodating recess 70 (second accommodating recess). A suitable example of the insulating material includes oxide ceramics such as alumina or zirconia. Alternatively, a base that is made up of an electrically conductive base body of metal or the like coated with an insulating membrane such as an oxide film may be adopted. As a method of coating the base with the insulating membrane, any of known vacuum deposition methods such as Atomic Layer Deposition (ALD) or spattering may be adopted. Alternatively, a SOG (spin on glass) membrane may be formed as the insulating membrane.

The depth (in the Y1-Y2 direction in FIG. 7) and the width (in the X1-X2 direction in FIG. 7) of the first accommodating recess 70 substantially match the thickness and the width of the first substrate 32 of the analytical cell 30, respectively. Further, a third through hole 74 (second electron beam transmission hole) having a substantially square shape in a plan view is formed so as to penetrate from the bottom surface (Y2 side end surface in FIG. 7) of the first accommodating recess 70 to the bottom surface of the base 72 on the Y1 side.

A first pedestal 76 having a quadrangular prism shape is joined to a substantially middle portion of the base 72 in the longitudinal direction (X1-X2 direction). The first pedestal 76 is made of insulating material such as rubber. A first adapter side flat spring 78a to a fifth adapter side flat spring 78e as second electrical connection members are placed on the first pedestal 76. That is, the number of the second electrical connection members (first adapter side flat spring 78a to fifth adapter side flat spring 78e) is the same as the number of the first electrical connection members (first electrode 42a to fifth electrode 42e). These first adapter side flat spring 78a to fifth adapter side flat spring 78e are made of material having good electrical conductivity, for example, metal such as copper, phosphor bronze, etc. Each of the surfaces of the first adapter side flat spring 78a to the fifth adapter side flat spring 78e may be gold-plated.

A first cover member 80 made of insulating material such as rubber is joined to the first pedestal 76 using adhesive. Therefore, the first adapter side flat spring 78a to the fifth adapter side flat spring 78e are fixed to the first pedestal 76 and the first cover member 80 using adhesive. Stated otherwise, the first adapter side flat spring 78a to the fifth adapter side flat spring 78e is sandwiched between the first pedestal 76 and the first cover member 80, whereby the adapter 14 holds the first adapter side flat spring 78a to the fifth adapter side flat spring 78e. Since all of the first pedestal 76, the first cover member 80, and the adhesive have insulating properties, no short-circuiting occurs among the first adapter side flat spring 78a to the fifth adapter side flat spring 78e.

Figure 7:
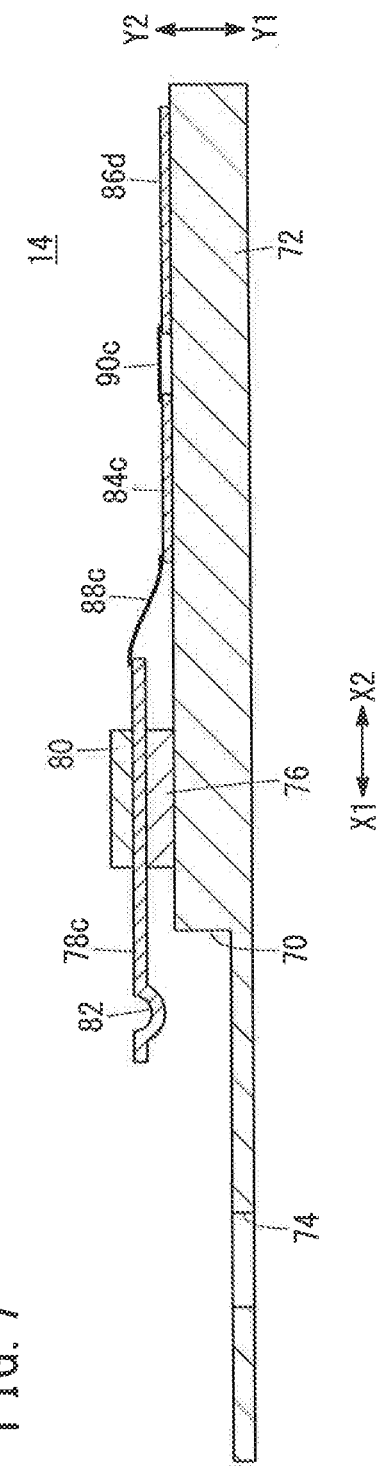
FIG. 7 is a cross sectional view taken along line VII-VII indicated by arrows in FIG. 6.
Figure 8:
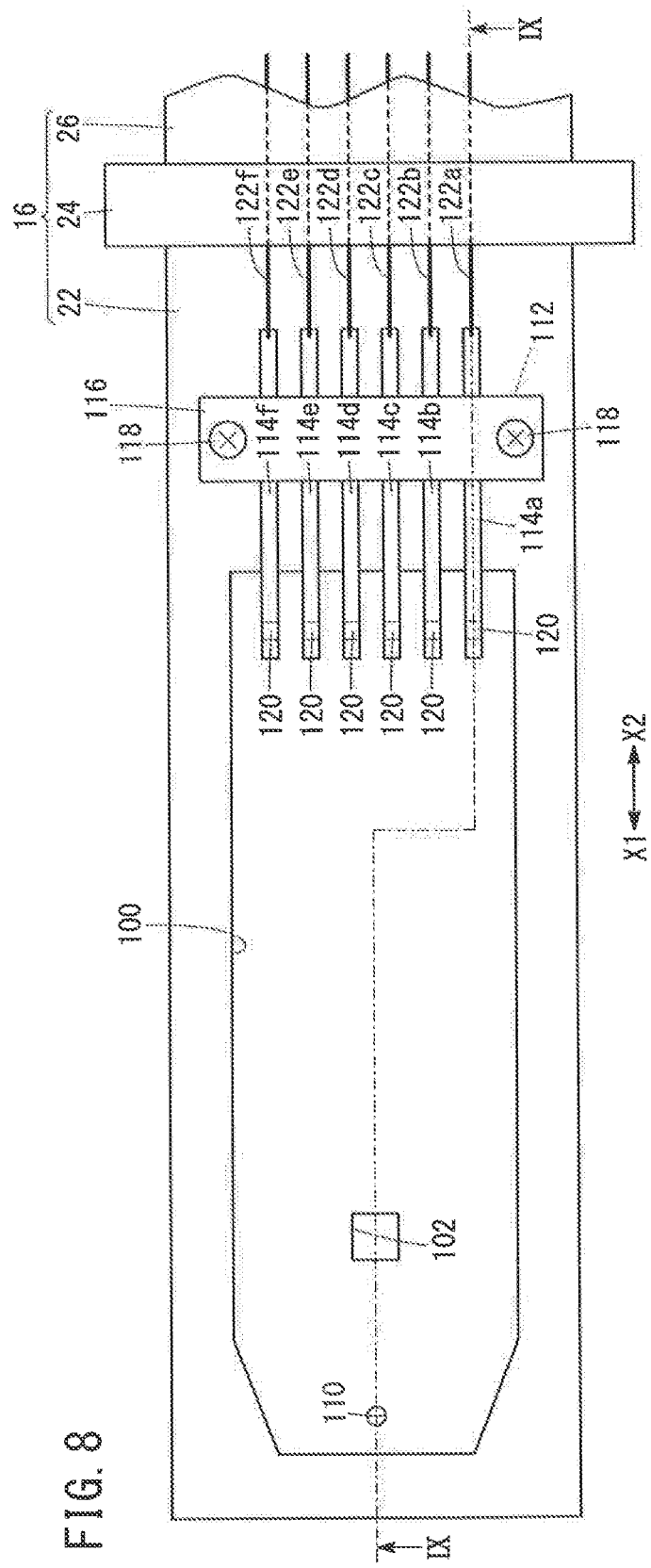
FIG. 8 is an overall plan view schematically showing the adapter attaching part.

Each of the first adapter side flat spring 78a to the fifth adapter side flat spring 78e has a first spring portion 82 curved toward the first accommodating recess 70 (Y1 side in FIG. 7). The first spring portions 82 contact respectively the ends of the first electrode 42a to the fifth electrode 42e on the X2 side exposed from the overlapping portion of the analytical cell 30. By this contact, all of the first electrode 42a to the fifth electrode 42e (first electrical connection members) are electrically connected respectively to the first adapter side flat spring 78a to the fifth adapter side flat spring 78e (second electrical connection members).

A first relay electrically conductive membrane 84a to a fifth relay electrically conductive membrane 84e (relay electrical conductors), and a first electrically conductive membrane 86a to a sixth electrically conductive membrane 86f, which are third electrical connection members, are formed on the base 72 at locations on the X2 side of the first pedestal 76. That is, in this case, the number of the third electrical connection members is larger than the number of the second electrical connection members by one. For example, the first relay electrically conductive membrane 84a to the fifth relay electrically conductive membrane 84e, and the first electrically conductive membrane 86a to the sixth electrically conductive membrane 86f are thin membranes of metal such as gold, silver, copper, Al—Si—Cu alloy, Al—Si alloy, etc.

In order to form the first relay electrically conductive membrane 84a to the fifth relay electrically conductive membrane 84e, and the first electrically conductive membrane 86a to the sixth electrically conductive membrane 86f, the base 72 may be masked by metal masking or tape masking, and then vacuum deposition or coating may be applied to the base 72. Alternatively, electrically conductive ink may be applied to the base 72 without masking, and then the base 72 may be dried to form the first relay electrically conductive membrane 84a to the fifth relay electrically conductive membrane 84e and the first electrically conductive membrane 86a to the sixth electrically conductive membrane 86f.

The first adapter side flat spring 78a to the fifth adapter side flat spring 78e are electrically connected to the first relay electrically conductive membrane 84a to the fifth relay electrically conductive membrane 84e, respectively, through a first connection line 88a to a fifth connection line 88e. Further, the first relay electrically conductive membrane 84a and the second relay electrically conductive membrane 84b are electrically connected to the first electrically conductive membrane 86a and the second electrically conductive membrane 86b, respectively, through a sixth connection line 90a and a seventh connection line 90b. Further, the third relay electrically conductive membrane 84c to the fifth relay electrically conductive membrane 84e are electrically connected to the fourth electrically conductive membrane 86d to the sixth electrically conductive membrane 86f, respectively, through an eighth connection line 90c to a tenth connection line 90e.

In the above structure, all of the first adapter side flat spring 78a to the fifth adapter side flat spring 78e (second electrical connection members) are electrically connected respectively to the first electrically conductive membrane 86a, the second electrically conductive membrane 86b, the fourth electrically conductive membrane 86d to the sixth electrically conductive membrane 86f among the first electrically conductive membrane 86a to the sixth electrically conductive membrane 86f (third electrical connection members). In contrast, the third electrically conductive membrane 86c is electrically insulated from all of the first adapter side flat spring 78a to the fifth adapter side flat spring 78e.

That is, among the first electrically conductive membrane 86a to the sixth electrically conductive membrane 86f, the number of the electrically conductive membranes that are electrically connected to the first adapter side flat spring 78a to the fifth adapter side flat spring 78e is the same as the number of the first adapter side flat spring 78a to the fifth adapter side flat spring 78e, that is five. Among the first electrically conductive membrane 86a to the sixth electrically conductive membrane 86f, one electrically conductive membrane (in the embodiment of the present invention, the third electrically conductive membrane 86c) is not electrically connected to any of the first adapter side flat spring 78a to the fifth adapter side flat spring 78e.

Next, the adapter attaching part 16 to which the adapter 14 is attached will be described with reference to FIGS. 2, 3, 8, and 9.

The attaching part body 22 of the adapter attaching part 16 is made of insulating material. For example, preferably, the attaching part body 22 is made of oxide ceramics such as alumina or zirconia. Alternatively, the adapter attaching part 16 may be formed by coating an electrically conductive base body of metal, etc. with an insulating membrane such as an oxide membrane using a known vacuum deposition method such as ALD or sputtering. As the metal, for example, stainless steel of SUS 303, SUS 304 (which are based on notations according to Japanese Industrial Standard), aluminum (Al) alloy, molybdenum (Mo) alloy, etc. are used.

A second accommodating recess 100 (first accommodating recess) is formed at an end of the attaching part body 22 on the X1 side. The depth of the second accommodating recess 100 (in the Y1-Y2 direction in FIG. 9) substantially matches the thickness of the adapter 14, and the width (in the X1-X2 direction in FIG. 8) of the second accommodating recess 100 is larger than the adapter 14. Further, a fourth through hole 102 (first electron beam transmission hole) having a substantially square shape in a plan view is formed so as to penetrate from the bottom surface of the second accommodating recess 100 (end surface on the Y2 side in FIG. 9) to the bottom surface of the attaching part body 22 on the Y1 side.

A pressing member 106 is fixedly positioned at the end of the second accommodating recess 100 on the X1 side using a screw 104 (see FIGS. 2 and 3). That is, an insertion hole 108 is formed in the pressing member 106, and a screw hole 110 is formed in the bottom wall of the second accommodating recess 100. After the screw 104 is inserted into the insertion hole 108, the screw 104 is screw-engaged into the screw hole 110. As described later, the pressing member 106 presses the analytical cell 30 in a manner that the analytical cell 30 is sandwiched between the pressing member 106 and the attaching part body 22.

An insulating second pedestal 112 having a substantially quadrangular prism shape is provided upright, on the attaching part body 22, at a position slightly shifted from a substantially middle position in the longitudinal direction (X1-X2 direction) toward the X2 side. A first holder side flat spring 114a to a sixth holder side flat spring 114f as fourth electrical connection members are placed on the second pedestal 112. That is, the number of the fourth electrical connection members (the first holder side flat spring 114a to the sixth holder side flat spring 114f) is the same as the number of the third electrical connection members (the first electrically conductive membrane 86a to the sixth electrically conductive membrane 86f). The first holder side flat spring 114a to the sixth holder side flat spring 114f are made of a material having good electrical conductivity, for example, metal such as copper, etc.

Figure 9:
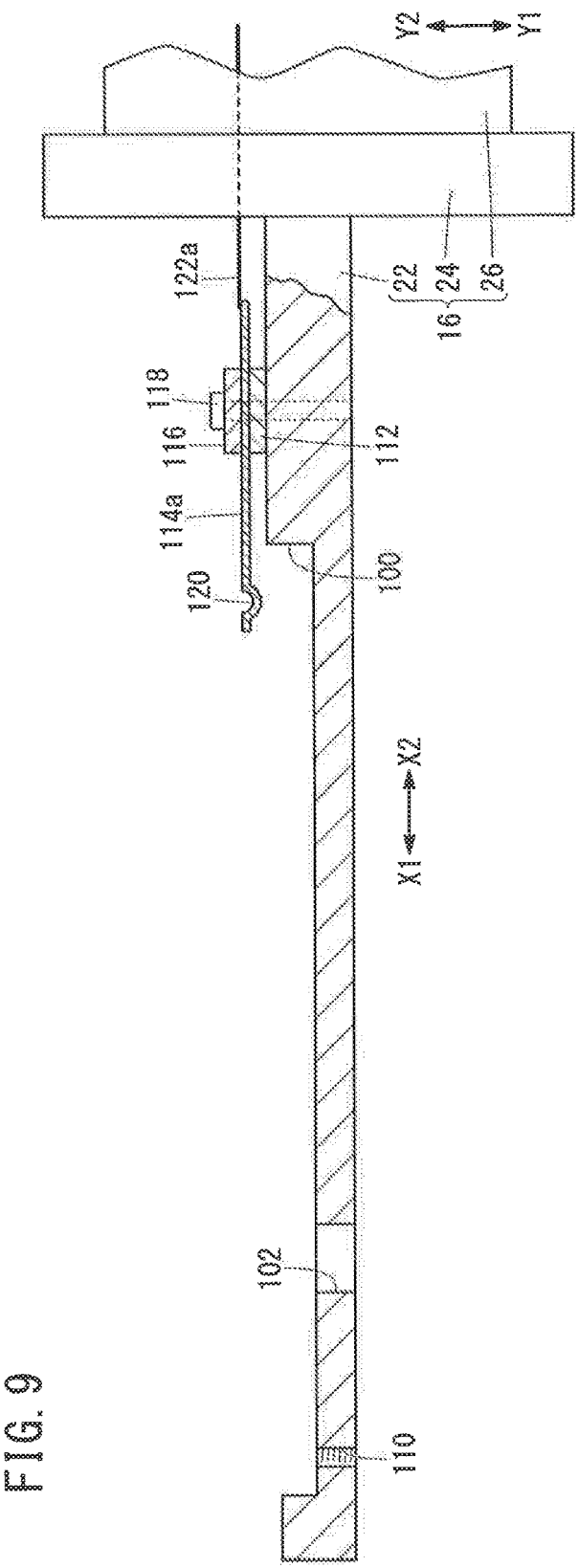
FIG. 9 is a cross sectional view taken along line IX-IX indicated by arrows in FIG. 8.

As shown in FIGS. 3 and 9, an insulating second cover member 116 is attached to the second pedestal 112 using screws 118. Accordingly, in the state where the first holder side flat spring 114a to the sixth holder side flat spring 114f are spaced from one another, the first holder side flat spring 114a to the sixth holder side flat spring 114f are sandwiched between the second pedestal 112 and the second cover member 116. In the structure, the first holder side flat spring 114a to the sixth holder side flat spring 114f are held by the adapter attaching part 16. Since both of the second pedestal 112 and the second cover member 116 have insulating properties, no short-circuiting occurs among the first holder side flat spring 114a to the sixth holder side flat spring 114f.

As in the case of the first adapter side flat spring 78a to the fifth adapter side flat spring 78e, each of the first holder side flat spring 114a to the sixth holder side flat spring 114f has a second spring portion 120 curved toward the second accommodating recess 100 (Y1 side in FIG. 9). The second spring portions 120 contact respectively the first through sixth electrically conductive membranes 86a through 86f of the adapter 14. By this contact, all of the first electrically conductive membrane 86a through the sixth electrically conductive membrane 86f (third electrical connection members) are electrically connected respectively to the first holder side flat spring 114a to the sixth holder side flat spring 114f (fourth electrical connection members).

Each of the ends of the first holder side flat spring 114a to the sixth holder side flat spring 114f on the X2 side is exposed from the second pedestal 112 and the second cover member 116. A first wiring line 122a to a sixth wiring line 122f as electrically conductive members are electrically connected to the exposed ends on the X2 side, respectively. That is, the number of the fourth electrical connection members (first holder side flat spring 114a through sixth holder side flat spring 114f) is the same as the number of the first wiring line 122a through the sixth wiring line 122f (electrically conductive members). All of the first holder side flat spring 114a to the sixth holder side flat spring 114f (fourth electrical connection members) are electrically connected respectively to the first wiring line 122a to the sixth wiring line 122f (electrically conductive members).

The first wiring line 122a to the sixth wiring line 122f are inserted into the cylindrical part 18 through a passage hole (not shown) penetrating through the coupling flange 24. Further, the first wiring line 122a to the sixth wiring line 122f extend from the inside of the cylindrical part 18 to the connector attaching part 20, and are electrically connected to terminals (not shown) provided in the connector attaching part 20. To the terminals, a connector (not shown) of an external device is attached.

For holding the analytical cell 30 in the sample holder 10, firstly the analytical cell 30 is inserted into the first accommodating recess 70 of the adapter 14. At this time, the first electrode 42a to the fifth electrode 42e contact the first spring portions 82 of the first adapter side flat spring 78a to the fifth adapter side flat spring 78e, respectively. The first spring portions 82 elastically press the first electrode 42a to the fifth electrode 42e toward the bottom wall of the first accommodating recess 70, whereby the analytical cell 30 is pressed toward the bottom wall of the first accommodating recess 70. As a result, the analytical cell 30 is temporarily held in the adapter 14. By adjusting the height of the first pedestal 76, the pressing force of the first adapter side flat spring 78a through the fifth adapter side flat spring 78e with respect to the analytical cell 30 can be adjusted.

Next, the adapter 14 is placed in the second accommodating recess 100 formed in the attaching part body 22 of the adapter attaching part 16. At this time, the first electrically conductive membrane 86a to the sixth electrically conductive membrane 86f contact the second spring portions 120 of the first holder side flat spring 114a to the sixth holder side flat spring 114f, respectively. The second spring portions 120 elastically press the first electrically conductive membrane 86a to the sixth electrically conductive membrane 86f toward the bottom wall of the second accommodating recess 100, whereby the adapter 14 is pressed toward the bottom wall of the second accommodating recess 100. As a result, the adapter 14 is provisionally attached to the attaching part body 22. By adjusting the height of the second pedestal 112, the pressing force of the first holder side flat spring 114a through the sixth holder side flat spring 114f with respect to the adapter 14 can be adjusted.

Next, the screw 104 inserted into the insertion hole 108 of the pressing member 106 is screw-engaged into the screw hole 110 formed in the attaching part body 22. The pressing member 106 presses the adapter 14 toward the bottom wall of the second accommodating recess 100 through the analytical cell 30. Therefore, the analytical cell 30 is sandwiched between the adapter 14 and the pressing member 106, and also sandwiched between the adapter 14 and the first adapter side flat spring 78a to the fifth adapter side flat spring 78e. At the same time, the adapter 14 is sandwiched between the attaching part body 22 and the pressing member 106, and also sandwiched between the attaching part body 22 and the first holder side flat spring 114a to the sixth holder side flat spring 114f. In the manner as described above, the analytical cell 30 is held by the adapter 14, and the adapter 14 is attached to the attaching part body 22. That is, the analytical cell 30 is held in the sample holder 10 through the adapter 14. At this time, the fourth through hole 102, the third through hole 74, the first through hole 36, and the second through hole 50 are overlapped with each other in alignment.

Conversely, the adapter 14 may firstly be attached to the attaching part body 22, and thereafter the analytical cell 30 may be held by the adapter 14. Further, the pressing member 106 may be attached to the attaching part body 22.

Further, the sample holder 10 is attached to an analytical instrument such as a TEM. Then, the connector of the external device is coupled to the terminals of the connector attaching part 20. As a result, the first electrode 42a is electrically connected to the external device through the first adapter side flat spring 78a, the first relay electrically conductive membrane 84a, the first electrically conductive membrane 86a, the first holder side flat spring 114a, the first wiring line 122a, the terminal, and the connector. Likewise, the second electrode 42b is electrically connected to the external device through the second adapter side flat spring 78b, the second relay electrically conductive membrane 84b, the second electrically conductive membrane 86b, the second holder side flat spring 114b, the second wiring line 122b, the terminal, and the connector.

Further, the third electrode 42c is electrically connected to the external device through the third adapter side flat spring 78c, the third relay electrically conductive membrane 84c, the fourth electrically conductive membrane 86d, the fourth holder side flat spring 114d, the fourth wiring line 122d, the terminal, and the connector. Further, the fourth electrode 42d is electrically connected to the external device through the fourth adapter side flat spring 78d, the fourth relay electrically conductive membrane 84d, the fifth electrically conductive membrane 86e, the fifth holder side flat spring 114e, the fifth wiring line 122e, the terminal, and the connector, and the fifth electrode 42e is electrically connected to the external device through the fifth adapter side flat spring 78e, the fifth relay electrically conductive membrane 84e, the sixth electrically conductive membrane 86f, the sixth holder side flat spring 114f, the sixth wiring line 122f, the terminal, and the connector.

In contrast, the third electrically conductive membrane 86c is electrically connected to the external device through the third holder side flat spring 114c, the third wiring line 122c, the terminal, and the connector. However, the third electrically conductive membrane 86c is not electrically connected to any of the first relay electrically conductive membrane 84a to the fifth relay electrically conductive membrane 84e. Stated otherwise, none of the first electrode 42a to the fifth electrode 42e is electrically connected to the third electrically conductive membrane 86c.

As described above, the analytical cell 30 has the first electrical connection members (first electrode 42a to fifth electrode 42e), and the adapter 14 has the second electrical connection members (first adapter side flat spring 78a to fifth adapter side flat spring 78e). The number of the first electrical connection members and the number of the second electrical connection members are the same. Further, the adapter 14 has the third electrical connection members (first electrically conductive membrane 86a to sixth electrically conductive membrane 86f), and the attaching part body 22 has the fourth electrical connection members (first holder side flat spring 114a to sixth holder side flat spring 114f). The number of the third electrical connection members and the number of the fourth electrical connection members are the same. The number of the third electrical connection members is larger than the number of the first electrical connection members. Therefore, even in the case where the number of electrical contacts (first electrode 42a to fifth electrode 42e) in the analytical cell 30 is different from the number of electrically conductive members (first wiring line 122a to sixth wiring line 122f) in the holder body 12, all of the first electrode 42a to the fifth electrode 42e of the analytical cell 30 can be electrically connected to the external device.

Since the number of first electrode 42a to the fifth electrode 42e and the number of the first adapter side flat spring 78a to the fifth adapter side flat spring 78e are the same, the first spring portions 82 of the first adapter side flat spring 78a to the fifth adapter side flat spring 78e contact the first electrode 42a to the fifth electrode 42e, respectively. Therefore, the analytical cell 30 is pressed substantially uniformly by the first adapter side flat spring 78a to the fifth adapter side flat spring 78e. In the structure, the analytical cell 30 is not detached from the first accommodating recess 70 easily.

Likewise, since the number of the first electrically conductive membrane 86a to the sixth electrically conductive membrane 86f and the number of the first holder side flat spring 114a to the sixth holder side flat spring 114f are the same, the second spring portions 120 of the first holder side flat spring 114a to the sixth holder side flat spring 114f contact the first electrically conductive membrane 86a to the sixth electrically conductive membrane 86f, respectively. Thus, since the adapter 14 is substantially uniformly pressed by the first holder side flat spring 114a to the sixth holder side flat spring 114f, the adapter 14 is not detached from the second accommodating recess 100 easily.

At the time of discharging of the analytical cell 30, electric current is collected through the first electrode 42a and the fifth electrode 42e. At the time of charging of the analytical cell 30, electrical current is supplied through the first electrode 42a and the fifth electrode 42e. In the meanwhile, the electron beam enters the analytical cell 30 through the second through hole 50 thereof, and is transmitted through the second transmission membrane 52, the liquid tight space, and the first transmission membrane 40. Then, the electron beam passes through the third through hole 74 of the adapter 14, and the electron beam is emitted to the outside through the fourth through hole 102 of the attaching part body 22. Based on the emitted electron beam, information about what kind of electrochemical reaction is occurring is obtained. That is, it becomes possible to conduct the analysis by the analytical instrument.

At the same time, the control voltage based on the reference electrode layer 48 disposed on the third electrode 42c is actually measured through the second electrode 42b and the fourth electrode 42d.

In the case where the number of the electrodes of the analysis target is different from that of the analytical cell 30, an adapter which is different from the above adapter 14 may be used. For example, if the analysis target has four electrodes (first electrical connection members), such an adapter may be used that has four adapter side flat springs as the second electrical connection members, and six electrically conductive membranes as the third electrical connection members.

As can be seen from the above, by changing an adapter with another adapter having the second electrical connection members that are as many as the first electrical connection members provided on the analysis target, it becomes possible to conduct the instrumental analysis without changing the holder body 12.

Further, by using the adapter having the second electrical connection members at positions corresponding to the respective positions of the first electronic connection members, it becomes possible to supply the electrical current to the analysis target.

As described above, in the embodiment of the present invention, simply by changing the adapter, various types of analysis targets can be held in the holder body 12.

Further, it is possible to conduct the instrumental analysis on the analysis target. Therefore, improvement in the versatility of the holder body 12 is achieved. Accordingly, the equipment investment is reduced, and advantages in terms of cost can be obtained.

The present invention is not limited to the embodiment described above, and various modifications can be made without deviating from the scope of the present invention.

For example, as long as the number of the second electrical connection members of the adapter is the same as the number of the first electrical connection members of the analysis target, and the number of the electrically conductive membranes, which are the third electrical connection members, of the adapter is the same as the number of the electrically conductive members of the holder body 12, the numbers of these members are not limited to the numbers illustrated in the above embodiment. The number of the third electrical connection members which are not electrically connected to the second electrical connection members is not limited to one, but may be two or more.

Further, the analysis target may be heated by supplying electric current to the first electrical connection members of the analysis target. In the instrumental analysis, it may be possible to analyze what kind of changes are occurring in the analysis target which is in the middle of being heated.

Further, it is not essential to provide the first relay electrically conductive membrane 84a to the fifth relay electrically conductive membrane 84e. The second electrical connection members may be directly connected to the third electrical connection members that are as many as the second electrical connection members.

What is claimed is:

1. A sample holder for an analytical instrument, for a holding an analysis target having one or more first electrical connection members, in the analytical instrument, the sample holder comprising:
   an adapter which holds the analysis target;
   an adapter attaching part to which the adapter holding the analysis target is removably attached;
   a cylindrical part which accommodates therein electrically conductive members electrically connected to the first electrical connection members; and
   a connector attaching part to which a connector electrically connected to the electrically conductive members is attached,
   wherein:
      the adapter has second electrical connection members and third electrical connection members,
      a total number of the second electrical connection members is the same as a total number of the first electrical connection members, and each of the first electrical connection members is electrically connected to a different respective one of the second electrical connection members,
      a total number of the third electrical connection members is larger than the total number of the second electrical connection members, and each of the second electrical connection members is electrically connected to a different respective one of the third electrical connection members such that at least one of the third electrical connection members is not electrically connected to any of the second electrical connection members,
      the adapter attaching part has fourth electrical connection members, a total number of the fourth electrical connection members is the same as the total number of the third electrical connection members and also the same as a total number of the electrically conductive members; and
      each of the fourth electrical connection members is electrically connected to a different respective one of the third electrical connection members and also to a different respective one of the electrically conductive members.

2. The sample holder according to claim 1, wherein a first electron beam transmission hole is formed in the adapter attaching part, and a second electron beam transmission hole overlapped with the first electron beam transmission hole is formed in the adapter.

3. The sample holder according to claim 1, wherein the adapter is removably accommodated in a first accommodating recess formed in the adapter attaching part, and the analysis target is removably accommodated in a second accommodating recess formed in the adapter.

4. The sample holder according to claim 3, wherein the adapter is sandwiched between the adapter attaching part and the fourth electrical connection members, and also sandwiched between the adapter attaching part and a pressing member.

5. The sample holder according to claim 4, wherein the analysis target is sandwiched between the adapter and the second electrical connection members, and also sandwiched between the adapter and the pressing member.

6. The sample holder according to claim 1, wherein at least either the second electrical connection members or the fourth electrical connection members are flat springs.

7. The sample holder according to claim 1, further comprising relay electrical conductors provided with the adapter, wherein all of the second electrical connection members are respectively, electrically connected to an equal number of the third electrical connection members through respective ones of the relay electrical conductors.

8. The sample holder according to claim 7, wherein a total number of the relay electrical conductors is same as the total number of the second electrical connection members, and each of the relay electrical conductors is electrically connected to a different respective one of the second electrical connection members.

9. The sample holder according to claim 7, wherein the relay electrical conductors are electrically conductive membranes.

10. The sample holder according to claim 8, wherein the relay electrical conductors are electrically connected to the second electrical connection members through connection lines.

11. The sample holder according to claim 7, wherein the relay electrical conductors are electrically connected to the third electrical connection members through connection lines.

12. The sample holder according to claim 1, wherein the third electrical connection members are electrically conductive membranes.

13. The sample holder according to claim 1, wherein the sample holder includes plural different adapters which are selectively connected to the adapter attaching part and the analysis target based on a number of first electrical connection members included with the analysis target.

14. The sample holder according to claim 1, wherein the adapter is configured to supply an electrical current to the analysis target through the first electrical connection members of the analysis target regardless of a number and installation positions of the first electrical connection members.

* * * * *